United States Patent [19]

Shibata

[11] Patent Number: 5,350,712

[45] Date of Patent: Sep. 27, 1994

[54] METHOD OF MANUFACTURING A SEMICONDUCTOR IC DEVICE HAVING MULTILAYER INTERCONNECTION STRUCTURE

[75] Inventor: Hideki Shibata, Yokohama, Japan

[73] Assignee: Kabushiki Kaisha Toshiba, Kawasaki, Japan

[21] Appl. No.: 121,554

[22] Filed: Sep. 16, 1993

[30] Foreign Application Priority Data

Sep. 18, 1992 [JP] Japan .................................. 4-249697

[51] Int. Cl.⁵ .......................................... H01L 21/44
[52] U.S. Cl. ..................... 437/195; 437/189; 437/192; 437/196; 437/228
[58] Field of Search ............... 437/195, 203, 194, 192, 437/189, 228, 196, 200; 148/DIG. 102

[56] References Cited

U.S. PATENT DOCUMENTS

| | | | |
|---|---|---|---|
| 4,968,644 | 11/1990 | Gallagher et al. | 437/192 |
| 5,100,838 | 3/1992 | Dennison | 437/195 |
| 5,187,121 | 2/1993 | Cote et al. | 437/189 |
| 5,286,674 | 2/1994 | Roth et al. | 437/195 |

FOREIGN PATENT DOCUMENTS

| | | | |
|---|---|---|---|
| 0444695 | 9/1991 | European Pat. Off. | 437/194 |
| 0119851 | 7/1984 | Japan | 437/195 |
| 3058424 | 3/1991 | Japan | 437/195 |

Primary Examiner—Tom Thomas
Assistant Examiner—Tuan Nguyen
Attorney, Agent, or Firm—Finnegan, Henderson, Farabow, Garrett & Dunner

[57] ABSTRACT

A first insulating layer is formed on the major surface of a semiconductor substrate, and a first-level metal wiring layer is formed on the first insulating layer. A refractory metal layer is selectively grown on that side portion (or those side and upper portions) of the first-level metal wiring layer which is (or are) located in the vicinity of a contact formation region of the first-level metal wiring layer. A second insulating layer is formed on the resultant structure, and then a through hole is formed by the RIE method in the first-level metal wiring layer in the contact formation region. The first-level metal wiring layer, or the first-level metal wiring layer and part of the refractory metal layer are exposed through the through hole. A second-level metal wiring layer is formed such that it fills the through hole, extends on part of the second insulating layer, and is electrically connected to the first-level metal wiring layer.

10 Claims, 6 Drawing Sheets

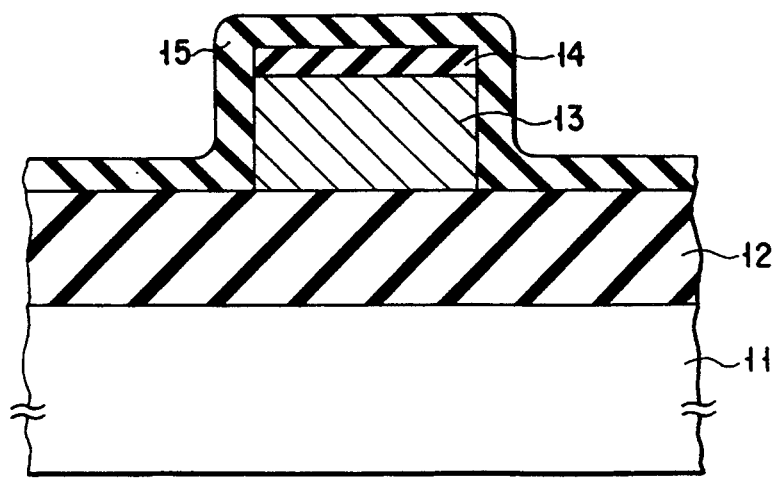
F I G. 5
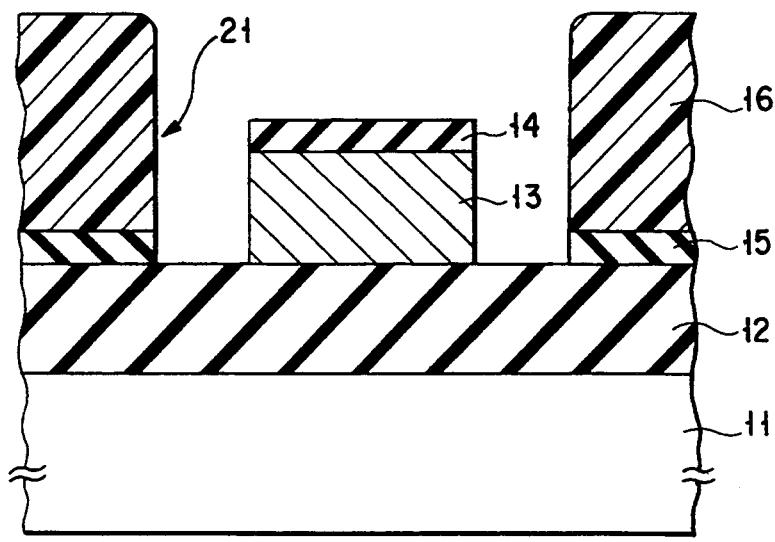
F I G. 6
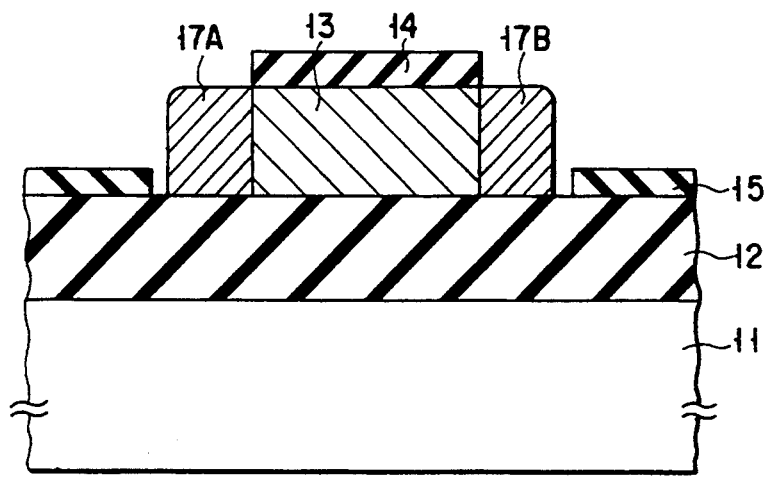
F I G. 7

METHOD OF MANUFACTURING A SEMICONDUCTOR IC DEVICE HAVING MULTILAYER INTERCONNECTION STRUCTURE

BACKGROUND OF THE INVENTION

1. Field of the Invention

This invention relates to a semiconductor IC device having a multilayer interconnection structure and a method for manufacturing the device, and more particularly to a connecting structure between a first-level metal wiring layer and a second-level metal wiring layer and a method for forming the structure.

2. Description of the Related Art

In the case of conventional semiconductor IC devices, a first-level metal wiring layer is electrically connected to a second-level metal wiring layer as shown in FIG. 1. First, a semiconductor layer 41 consisting of an impurity diffusion layer or the like, which serves as wiring or an active region of semiconductor elements, is formed in a major surface region of a semiconductor substrate 40. Then, a first interlayer insulating film 42 is formed on the semiconductor layer 41, and a first-level metal wiring layer 43 is formed on the insulating film 42. The wiring layer 43 is obtained by forming a metal layer by sputtering and then patterning the metal layer. A second interlayer insulating film 44 is provided on the insulating film 42 and the wiring layer 43. Subsequently, a through hole 45 is formed, by photoetching process (PEP) and reactive ion etching (RIE), in that portion of the second interlayer insulating film 44 which is located on the wiring layer 43. A metal layer is formed by sputtering on an exposed portion of the wiring layer 43 and on the insulating film 44, and is then patterned to form a second-level metal wiring layer 46 electrically connected to the first-level metal wiring layer 43.

In general, as is shown in FIG. 1, the first-level metal wiring layer 43 has right and left end portions of a width $\Delta a$ which are provided in consideration of mask misalignment, which may occur when a mask is aligned with the wiring layer 43 in order to form the through hole 45. Thus, the first-level metal wiring layer 43 has a width $2\Delta a$ wider than the through hole 45.

FIG. 2 shows the structure of a contact portion obtained when a mask misalignment has occurred where there is no width allowance. As is shown in FIG. 2, where no width allowance is imparted to the wiring layer 43, if a mask is misaligned from a correct position at the time of forming the through hole 45 by use of the RIE method, part of the semiconductor layer 41 and part of the interlayer insulating film 42 may be etched as well as part of the interlayer insulating film 44, thereby short-circuiting the second-level metal wiring layer 46 and the semiconductor layer 41 or the substrate 40. Further, the contact area between the first and second metal wiring layers 43 and 46 will be reduced, and accordingly the contact resistance be increased. To obtain satisfactory contact, it is necessary to provide a relatively wide width $\Delta a$ at each of the right and left ends of the first-level metal wiring layer 43 in consideration of misalignment of a mask which may occur at the time of forming the through hole 45.

However, imparting the first-level metal wiring layer with a sufficient width allowance will limit high densification of layers of the same type in the case of a pattern layout as shown in FIG. 3, in which the contact portions of the layers are adjacent to one another. FIG. 3 shows an example of a pattern layout as regards the first-level metal wiring layer 43 shown in FIG. 1, in which only two adjacent metal wiring layers 43-1 and 43-2 are shown. Each of the layers 43-1 and 43-2 has a region $2\Delta a$ wider than the other region of a width $\Delta W$ formed around its contact portion 45-1 or 45-2 contacting a corresponding second-level metal wiring layer. Accordingly, a distance $\Delta d1$ between the wider regions (located around the contact portions) of the adjacent layers 43-1 and 43-2 is narrower by $2\Delta a$ than a distance $\Delta d2$ between the other regions. Further, the distance between the axes of the adjacent layers 43-1 and 43-2 is "$\Delta W + \Delta d2$".

In this case, if the distance $\Delta d1$ between the wider regions of each adjacent pair of first-level metal wiring layers is kept at a minimum pitch, i.e., at a minimum distance determined by the design rule, the distance $\Delta d2$ between the other regions is larger by $2\Delta a$ than the minimum pitch $\Delta d1$. This means that high densification of the first-level metal wiring layers 43 is limited by the allowance value $\Delta a$. Although the width $\Delta W$ of the first-level metal wiring layer 43 has been reduced in accordance with development of a technique for refining semiconductor elements, the allowance value $\Delta a$ cannot greatly be reduced. Thus, the ratio of the allowance $\Delta a$ to the wiring pitch $\Delta d1$ has been increased, and has become a factor in the prevention of high integration of a semiconductor device.

SUMMARY OF THE INVENTION

It is a first object of the invention to provide a semiconductor IC device capable of achieving high integration.

It is a second object of the invention to provide a semiconductor IC device capable of highly integrating wiring layers and enhancing the reliability of the contact portions of the wiring layers.

It is a third object of the invention to provide a semiconductor IC device free from defective contact due to mask misalignment which may occur at the time of forming a through hole in an insulating film on a metal wiring layer.

It is a fourth object of the invention to provide a semiconductor IC device capable of preventing a contact resistance between a first-level metal wiring layer and a second-level metal wiring layer from increasing when a contact area therebetween is reduced due to occurrence of mask misalignment.

It is a fifth object of the invention to provide a method of manufacturing a semiconductor IC device capable of achieving high integration.

It is a sixth object of the invention to provide a method of manufacturing a semiconductor IC device capable of highly integrating wiring layers and enhancing the reliability of the contact portions of the wiring layers.

It is a seventh object of the invention to provide a method of manufacturing a semiconductor IC device free from defective contact due to mask misalignment which may occur at the time of forming a through hole in an insulating film on a metal wiring layer.

It is an eighth object of the invention to provide a method of manufacturing a semiconductor IC device capable of preventing a contact resistance between a first-level metal wiring layer and a second-level metal wiring layer from increasing when a contact area therebetween is reduced due to occurrence of mask misalignment.

The first through fourth objects can be attained by a semiconductor integrated circuit device comprising: a semiconductor substrate; a first insulating layer formed on the semiconductor substrate; a first-level metal wiring layer formed on the first insulating layer; a metal layer formed at least on that side portion of the first-level metal wiring layer which is located in the vicinity of a contact formation region of the first-level metal wiring layer; a second insulating layer formed on the first insulating layer, the first-level metal wiring layer, and the metal layer, and having a through hole formed such that at least one of the contact formation region and part of the metal layer is exposed; and a second-level metal wiring layer filling the through hole, formed on part of the second insulating layer, and electrically connected to the first-level metal wiring layer.

The fifth through eighth objects can be attained by a method of manufacturing a semiconductor integrated circuit device, comprising the steps of: forming a first insulating layer on a major surface of a semiconductor substrate; forming a first-level metal wiring layer on the first insulating layer; forming a second insulating layer on the first insulating layer and the first-level metal wiring layer; coating the second insulating layer with a photoresist, and removing that part of the photoresist which is coated on a region of the first-level metal wiring layer containing the contact formation region; exposing part of the first-level metal wiring layer by removing at least that part of the second insulating layer which is located on the side portion of the first-level metal wiring layer in the vicinity of the contact formation region; increasing the width of the contact formation region of the first-level metal wiring layer by forming a metal layer on the exposed surface of the first-level metal wiring layer; forming a third insulating layer on the second insulating layer, the first-level metal wiring layer, and the metal layer; forming, by anisotropic etching, a through hole in that portion of the third insulating layer which is located on the contact formation region of the first-level metal wiring layer; and forming a second-level metal wiring layer such that it fills the through hole, extends on part of the third insulating layer, and is electrically connected to the first-level metal wiring layer.

By virtue of the above-described structure and method, first-level metal wiring layers can be arranged at minimum intervals determined by the design rule, since no design allowance is required. Thus, the semiconductor IC device of the invention can be highly integrated. Further, even if a mask is misaligned from a correct position at the time of forming the through hole, the semiconductor substrate or an impurity diffusion layer formed therein can be prevented from being etched since the metal layer formed in the vicinity of the contact portion serves as a stopper at the time of etching. As a result, the IC device is free from defective contact such as short-circuiting between the second-level metal wiring layer and the semiconductor substrate or the impurity diffusion region therein, which is caused by mask misalignment at the time of forming the through hole in the insulating layer on the first-level metal wiring layer. Moreover, even if the through hole extends into part of the metal layer due to mask misalignment, the contact area between the first- and second-level metal wiring layers is not reduced since the metal layer serves as part of the first-level metal wiring layer, so that the contact resistance can be prevented from increasing. Thus, wiring layers can be highly densified, and the reliability of the contact portions of the wiring layers can be enhanced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 4 to 8 are cross sectional views, showing a process for forming a contact portion in a semiconductor IC device according to a first embodiment of the present invention;

DETAILED DESCRIPTION OF THE PREFERRED EMBODIMENTS

Figure 9:
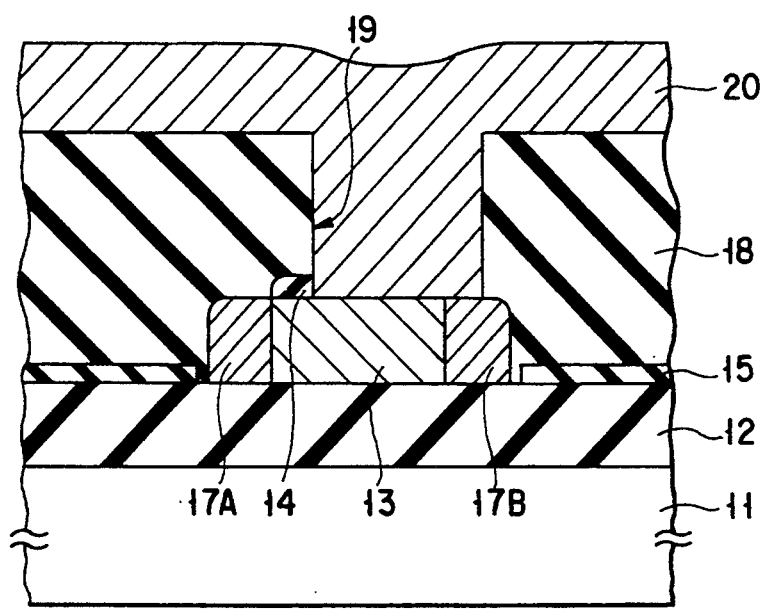
FIG. 9 is a cross sectional view, showing a structure containing the contact portion and formed when mask misalignment has occurred at the time of forming a through hole in a second interlayer insulating film.
Figure 10:
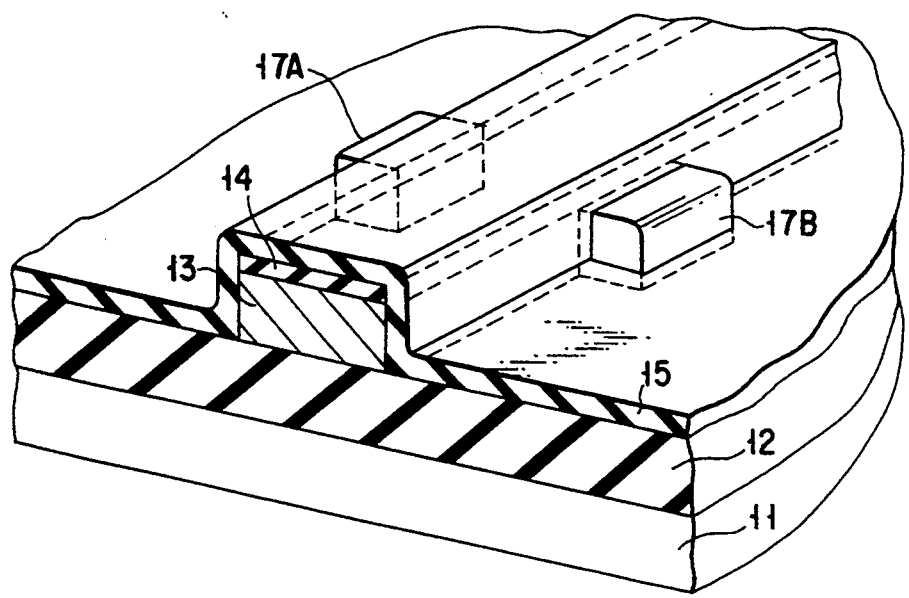
FIG. 10 is a perspective view of the structure containing the contact formation region and formed in the process of FIG. 7.
Figure 11:
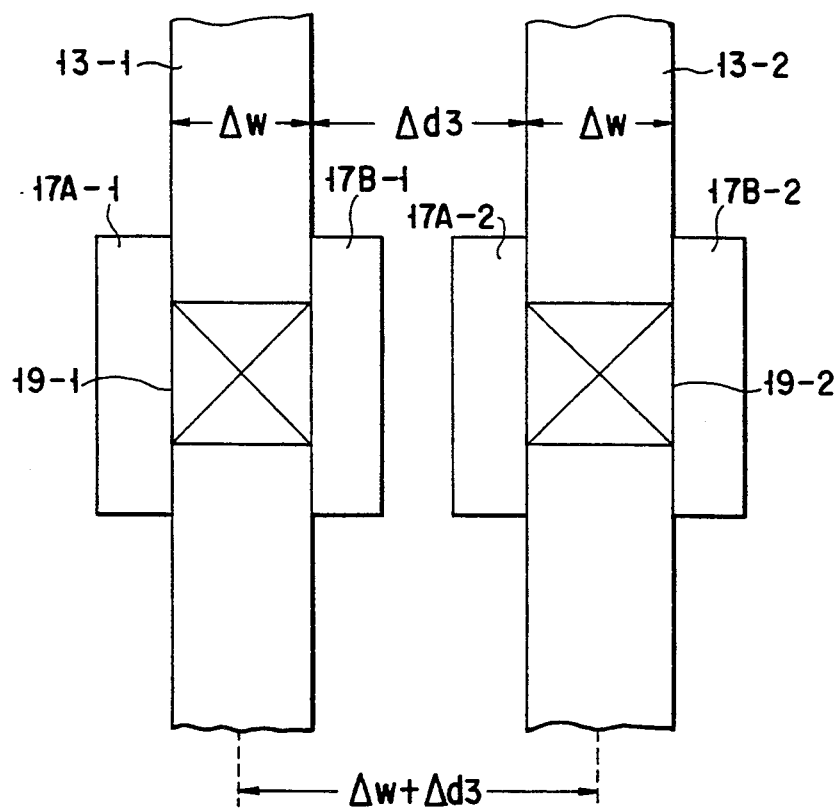
FIG. 11 is a plan view, showing a pattern layout of the first-level metal wiring layer shown in FIG. 8.

A semiconductor IC device according to a first embodiment of the invention will be explained with reference to FIGS. 4 to 11. FIGS. 4 to 8 show processes of forming a contact portion of the device. FIG. 9 is a cross sectional view obtained when mask misalignment has occurred at the time of forming a through hole in a second interlayer insulating film, and FIG. 10 is a perspective view of the structure containing the contact portion and formed in the process of FIG. 7. Further, FIG. 11 is a plan view, showing a pattern layout of the first-level metal wiring layer shown in FIG. 8.

Figure 4:
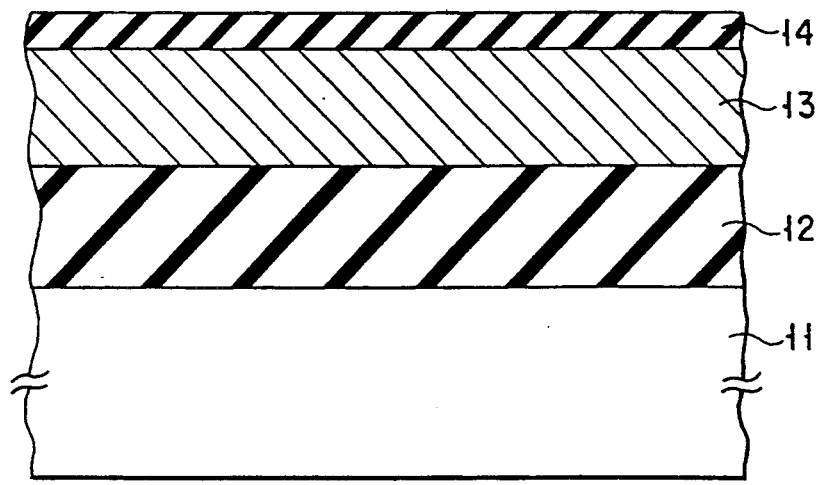

As is shown in FIG. 4, after a semiconductor element (not shown) is formed in a semiconductor substrate (e.g. a silicon substrate) 11, a first interlayer insulating film 12 is deposited on the substrate 11. In this embodiment, the first interlayer insulating film 12 consists of a CVD oxide film (silicon oxide film) of a thickness of 3000Å and a boro-phospho silicate glass film of a thickness of 8000Å laminated thereon. After the interlayer insulating film 12 is flattened by reflow, an aluminum alloy film 13 containing, for example, 1% silicon, 0.5% copper is formed on the insulating film 12 to provide a first-level metal wiring layer, and then a plasma nitride film (silicon nitride film) 14 of a thickness of 1000Å is deposited on the film 13.

As is shown in FIG. 5, the plasma nitride film 14 and the aluminum alloy film 13 are patterned by the PEP and RIE methods, thus providing the first-level metal wiring layer 13 and the nitride film 14 remaining thereon. Thereafter, a second plasma nitride film (silicon nitride film) 15 of a thickness of 1000Å is deposited on the resultant structure.

As is shown in FIG. 6, the resultant structure is coated with a photoresist 16, and then a window 21 is formed by removing, by exposed and developed, that portion of the photoresist 16 which is located in the vicinity of a region for later forming a contact portion between the first-level metal wiring layer 13 and a second-level metal wiring layer to be formed on the layer 13 in the following process. Subsequently, isotropic chemical dry etching (CDE) is performed with the use of an etching gas which etches the insulating film 12 at low etching rate, to remove the nitride film 15 remaining on side portions of the metal wiring layer 13. Thus, the layer 13 has exposed side portions.

Then, as is shown in FIG. 7, the remaining photoresist 16 is removed, and refractory metal layers (a tungsten layer is employed in this embodiment) 17A and 17B are grown on the exposed surfaces of the metal wiring layer 13 by the CVD method using, e.g., $WF_6$ gas and $SiH_4$ gas. As a result, the first-level metal wiring layer 13 has a wider width in the vicinity of the contact formation region. The width of each of the refractory metal layers 17A and 17B can be controlled reliably to an accurate value by changing a condition of the CVD method, such as the growing period of time. FIG. 10 is a perspective view of a structure obtained in this process in the vicinity of the contact portion.

Figure 8:
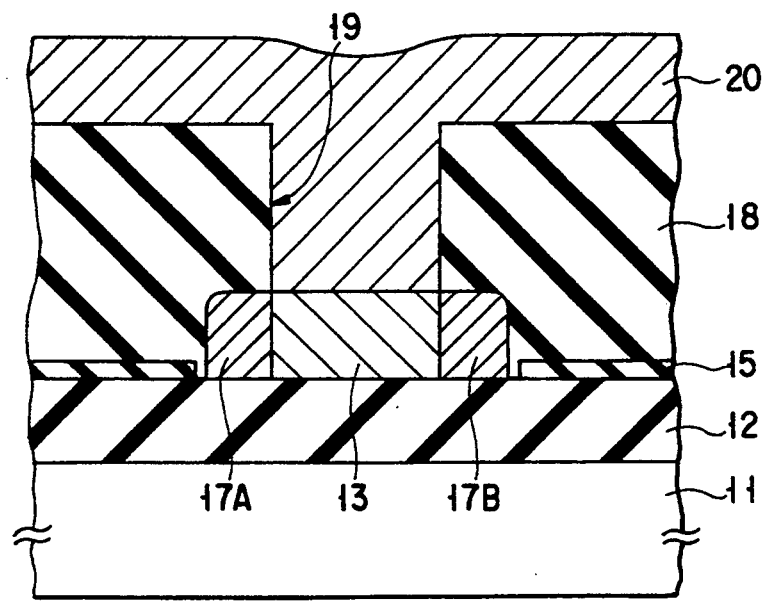

As is shown in FIG. 8, a second interlayer insulating film 18 consisting of e.g. a plasma oxide film (silicon oxide film) is deposited on the resultant structure, and the surface of the film 18 is flattened. Then, a through hole (via contact hole) 19 is formed in the second interlayer insulating film 18 by the use of an anisotropic etching method such as the RIE method, thus exposing the first-level metal wiring layer 13. The width of the through hole 19 is equal to or more than that of the wiring layer 13, but less than the sum of the width of the layer 13 and the width of the metal layer 17A or 17B. Subsequently, an aluminum alloy film, for example, is formed by sputtering on the insulating film 18 and the exposed surface of the wiring layer 13, and then the alloy film is patterned by means of the PEP and RIE methods. As a result, there is provided a second-level metal wiring layer 20 which is electrically connected to the first-level metal wiring layer 13 through the through hole 19.

FIG. 9 shows a structure containing the contact portion, obtained when a mask has been misaligned from a correct position at the time of aligning the mask on the first-level metal wiring layer 13 to form the through hole 19. If the amount of misalignment of the mask is smaller than the width of the metal layer 17A or 17B, the metal layer serves as a stopper against etching and prevents the first interlayer insulating film 12 or silicon substrate 11 from being etched. Further, since the refractory metal layers 17A and 17B have low resistance, and serves substantially as part of the first-level metal wiring layer 13, the contact area is not reduced and the contact resistance is not increased.

Figure 1:
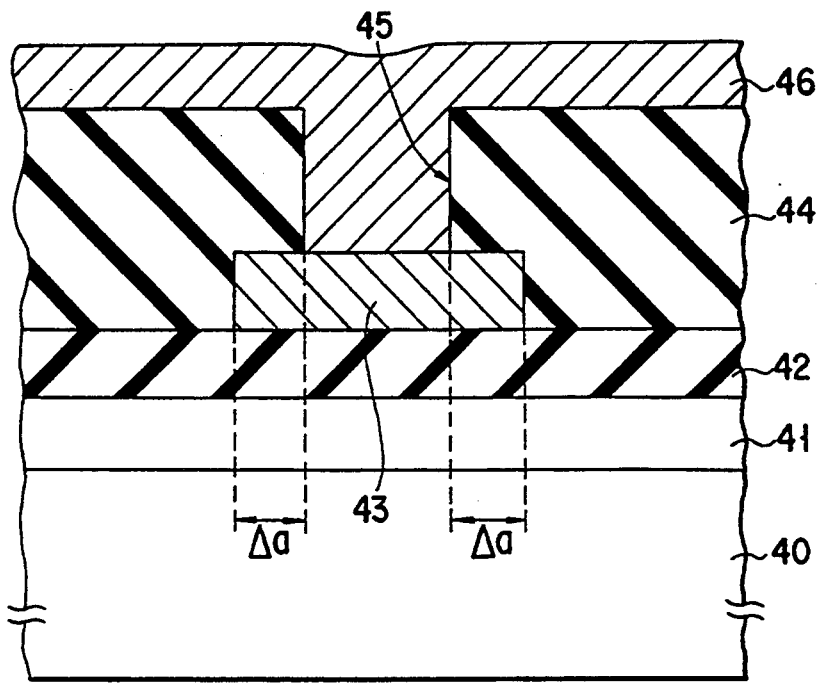
FIG. 1 is a cross sectional view of a conventional semiconductor IC device, showing a structure containing a contact portion formed between a first-level metal wiring layer and a second-level metal wiring layer.
Figure 2:
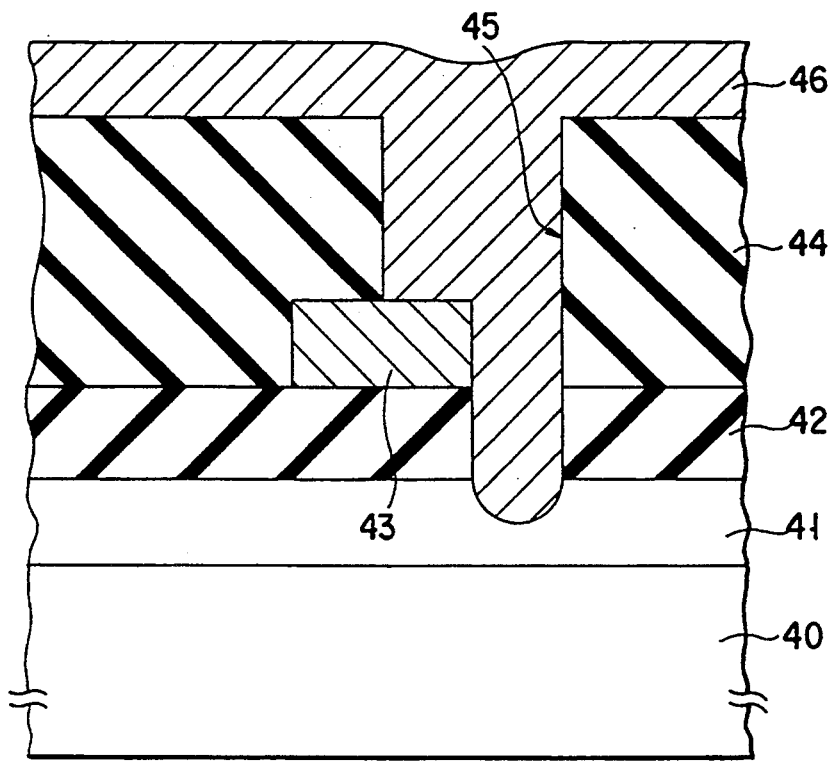
FIG. 2 is a cross sectional view of the conventional semiconductor IC device, showing a structure containing a contact portion between a first-level metal wiring layer and a second-level metal wiring layer, which structure is formed when mask misalignment has occurred at the time of no width allowance being provided at the first-level metal wiring layer.
Figure 3:
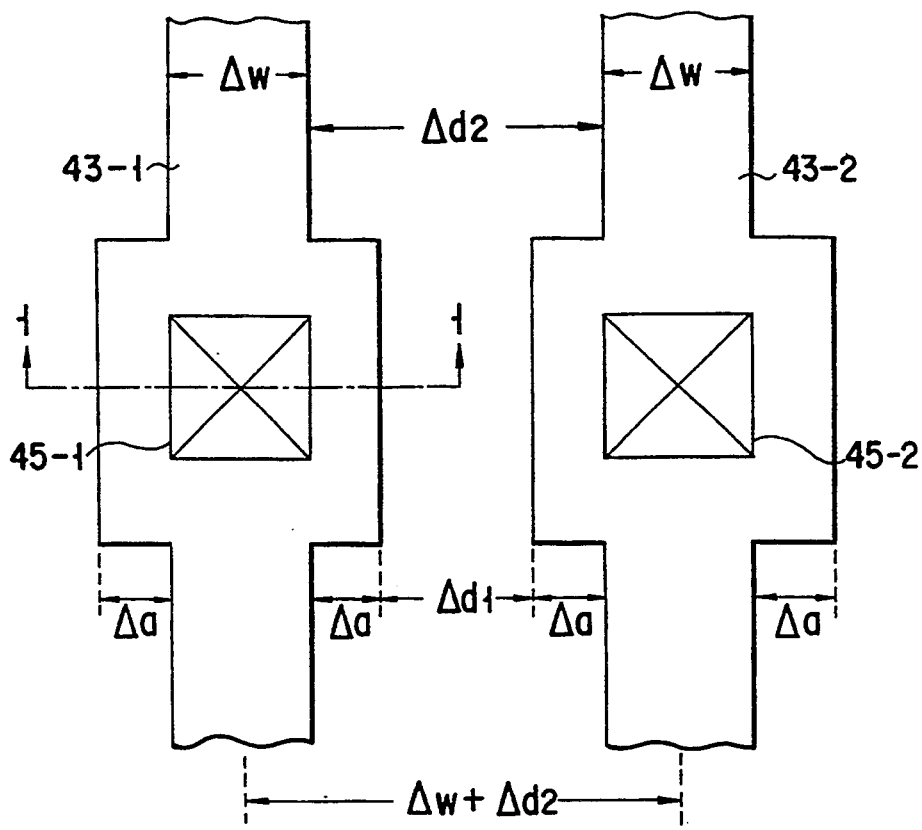
FIG. 3 is a plan view of the conventional semiconductor IC device, showing an example of a pattern layout of the first-level metal wiring layer.

FIG. 11 is a view of an example of a pattern layout of the first-level metal wiring layer shown in FIG. 8, showing adjacent two first-level metal wiring layers 13-1 and 13-2. The wiring layer 13-1 has refractory metal layers 17A-1 and 17B-1 formed on the right and left sides of the contact portion (through hole 19-1) between the first-level and second-level metal wiring layers, and the wiring layer 13-2 has refractory metal layers 17A-2 and 17B-2 formed on the right and left sides of the contact portion (through hole 19-2). Thus, the width of each of the contact portions is greater than that $\Delta W$ of the metal wiring layer 13-1 or 13-2. The distance $\Delta d3$ between the wiring layers 13-1 and 13-2 is set to a minimum value determined by the design rule, i.e., it is equal to the distance $\Delta d1$ shown in FIG. 3 ($\Delta d3 = \Delta d1$, $\Delta d3 < \Delta d2$). Further, the distance between the axes of the adjacent wiring layers 13-1 and 13-2 is "$\Delta W + \Delta d3$".

The above-described connecting structure between the first- and second-level metal wiring layers and the method of forming the structure can prevent defective contact such as short-circuiting between the second metal wiring layer 20 and the semiconductor substrate 11 (or an impurity diffusion layer formed in the substrate 11), which occurs due to mask misalignment at the time of forming the through hole 19, even if there is no width allowance in the first-level metal wiring layer 13. In other words, the refractory metal layers 17A and 17B grown on side portions of the metal wiring layer 13 serve as stoppers against etching at the time of forming the through hole 19. Therefore, so long as the amount of mask misalignment is smaller than the width of the metal layer 17A or 17B, the metal layer 17A or 17B can prevent the insulating film 12 or the substrate 11 from being etched. That is, the metal layer 17A or 17B serves as the aforementioned width allowance in the first-level metal wiring layer 13. Since the metal layers 17A and 17B are formed in a selective epitaxial growth process performed later than the patterning of the metal wiring layer 13, it is not necessary to limit the pitch of the wiring metal layers 13 so as to provide them with a width allowance, and hence the pitch can be set to a minimum value determined by the design rule. Moreover, even if the through hole 19 extends to part of the metal layer 17A or 17B as a result of mask misalignment, the contact area between the first- and second-level metal wiring layers can be prevented from reducing and therefore the contact resistance can be prevented from increasing, since the metal layers 17A and 17B have low resistances and serve substantially as part of the first-level metal wiring layer 13. As a result, a higher density wiring structure can be obtained, and more reliable contact portions can be formed in the wiring structure. In addition, since the first-level metal wiring layers 13 can be arranged at minimum intervals determined by the design rule, a highly integrated semiconductor device can be provided. Since the metal layers 17A and 17B are selectively grown only on those portions of the first-level metal wiring layer 13 which are located in the vicinity of the contact portion, there is almost no increase in parasitic capacity between each adjacent pair of first-level metal wiring layers.

Figure 12:
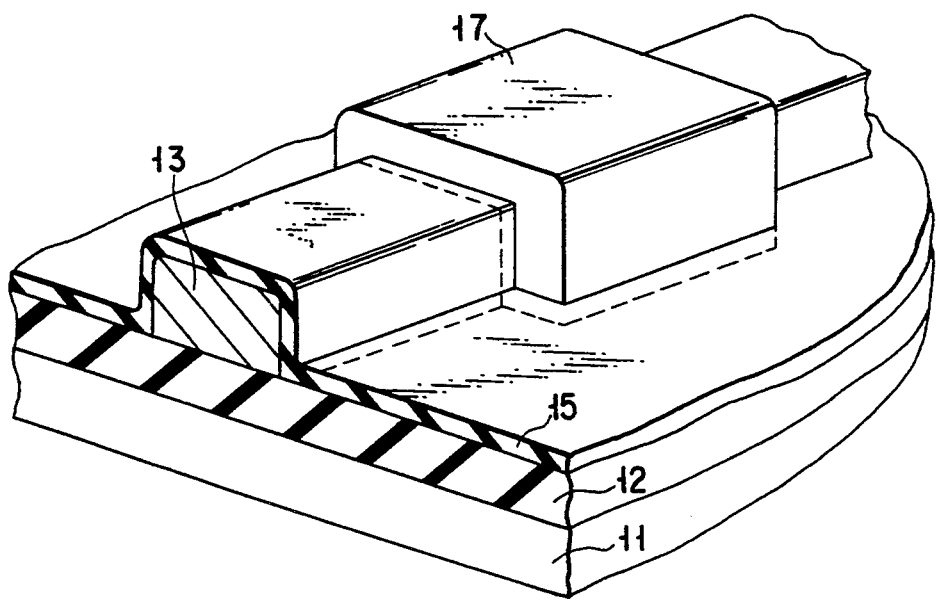
FIG. 12 is a perspective view of a structure containing a contact portion, useful in explaining a semiconductor IC device according to a second embodiment and a method of manufacturing the device.

Although in the first embodiment, the first plasma nitride film 14 is formed on the first-level metal wiring layer 13, and the refractory metal layers 17A and 17B are grown only on those side portions of the wiring layer 13 which are located in the vicinity of a contact formation region, the invention is not limited to this structure. Alternatively, no nitride layer may be formed in the process shown in FIG. 4, and instead, a refractory metal layer 17 may be formed over those upper and side portions of the first-level metal wiring layer 13 which are located in the vicinity of the contact formation region, as is shown in FIG. 12.

Figure 13:
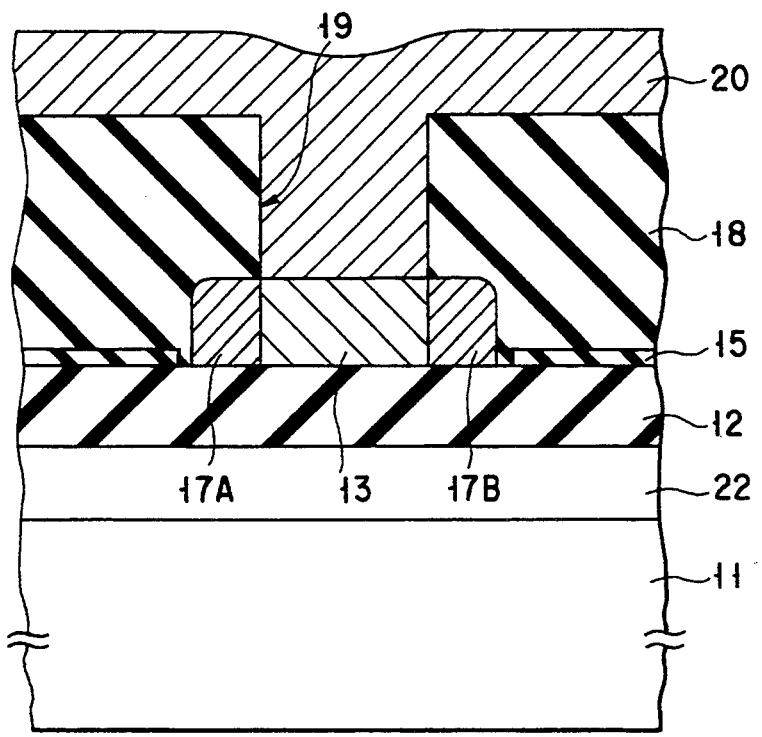
FIG. 13 is a perspective view of a structure containing a contact portion, useful in explaining a semiconductor IC device according to a third embodiment and a method of manufacturing the device.

FIG. 13 is provided for explaining a semiconductor IC device according to a third embodiment of the invention and a method of manufacturing the device, and shows a cross section of a structure containing a contact portion. In this embodiment, a semiconductor layer 22, which consists of an impurity diffusion layer, etc., and serves as a wire or an active region of a semiconductor element, is formed in the major surface of the silicon substrate 11. The semiconductor layer 22 is formed before the first interlayer insulating film 12 is formed on the silicon substrate 11. The other structural elements and a method for manufacturing them are similar to those employed in the first embodiment.

It is a matter of course that these structure and method can also provide the same advantage as the first embodiment.

The invention is not limited to the above-described first through three embodiments, but can be modified in various manners. For example, although in the embodiments, the semiconductor substrate is made of silicon, it may be made of another material. Further, although the refractory metal layer is made of tungsten, the metal layer may be made of at least one of other refractory metals such as titanium, molybdenum, etc., or made of at least one of a tungsten alloy, a titanium alloy, a molybdenum alloy, etc.

What is claimed is:

1. A method of manufacturing a semiconductor integrated circuit device, comprising the steps of:
   forming a first insulating layer on a major surface of a semiconductor substrate;
   forming a first-level metal wiring layer on the first insulating layer
   forming a second insulating layer on the first insulating layer and the first-level metal wiring layer;
   coating the second insulating layer with a photoresist, and removing that part of the photoresist which is coated on a region of the first-level metal wiring layer containing a contact formation region;
   exposing part of the first-level metal wiring layer by removing at least that part of the second insulating layer which is located on the side portion of the first-level metal wiring layer in the vicinity of the contact formation region;
   increasing the width of the contact formation region of the first-level metal wiring layer by forming a metal layer on the exposed surface of the first-level metal wiring layer;
   forming a third insulating layer on the second insulating layer, the first-level metal wiring layer, and the metal layer;
   forming, by anisotropic etching, a through hole in that portion of the third insulating layer which is located on the contact formation region of the first-level metal wiring layer; and
   forming a second-level metal wiring layer such that it fills the through hole, extends on part of the third insulating layer, and is electrically connected to the first-level metal wiring layer.

2. The method of manufacturing a semiconductor integrated circuit device according to claim 1, wherein the step of exposing part of the first-level metal wiring layer is performed by the use of an etching gas which can etch the first insulating layer at low rate and etch the second insulating layer at high rate.

3. The method of manufacturing a semiconductor integrated circuit device according to claim 1, wherein the metal layer is selectively grown on that side portion of the first-level metal wiring layer which is located in the vicinity of a contact portion between the first- and second-level metal wiring layers.

4. The method of manufacturing semiconductor integrated circuit device according to claim 1, wherein the metal layer is selectively grown on those upper and side portions of the first-level metal wiring layer which are located in the vicinity of a contact portion between the first- and second-level metal wiring layers.

5. The method of manufacturing a semiconductor integrated circuit device according to claim 1, wherein the metal layer is a refractory metal layer.

6. The method manufacturing a semiconductor integrated circuit device according to claim 5, wherein the refractory metal layer is made of at least one selected from the group consisting of tungsten, titanium and molybdenum.

7. The method of manufacturing semiconductor integrated circuit device according to claim 5, wherein the refractory metal layer is made of at least one selected from the group consisting of a tungsten alloy, a titanium alloy and a molybdenum alloy.

8. The method of manufacturing a semiconductor integrated circuit device according to claim 1, wherein the through hole has a width of at least equal to the first-level metal wiring layer, and smaller than the sum of the width of the first-level metal wiring layer and the width of the metal layer.

9. The method of manufacturing a semiconductor integrated circuit device according to claim 1, further comprising a semiconductor element formed in the semiconductor substrate.

10. The method of manufacturing semiconductor integrated circuit device according to claim 1, further comprising an impurity diffusion layer formed in the semiconductor substrate.

* * * * *

UNITED STATES PATENT AND TRADEMARK OFFICE
CERTIFICATE OF CORRECTION

PATENT NO. : 5,350,712
DATED : September 27, 1994
INVENTOR(S) : Hideki SHIBATA

It is certified that error appears in the above-indentified patent and that said Letters Patent is hereby corrected as shown below:

Claim 1, Column 7, Line 50 after "layer" insert --;--.

Claim 4, Column 8, Line 28 before "semiconductor" insert --a--.

Claim 6, Column 8, Line 37 before "manufacturing" insert --of--.

Claim 7, Column 8, Line 42 before "semiconductor" insert --a--.

Claim 10, Column 8, Line 57 before "semiconductor" insert --a--.

Signed and Sealed this

Thirtieth Day of May, 1995

Attest:

BRUCE LEHMAN

Attesting Officer        Commissioner of Patents and Trademarks